(12) United States Patent
Avramescu et al.

(10) Patent No.: US 9,318,651 B2
(45) Date of Patent: Apr. 19, 2016

(54) OPTOELECTRONIC SEMICONDUCTOR CHIP AND METHOD FOR PRODUCING THE LATTER

(71) Applicant: OSRAM Opto Semiconductors GmbH, Regensburg (DE)

(72) Inventors: Adrian Stefan Avramescu, Regensburg (DE); Patrick Rode, Regensburg (DE); Martin Strassburg, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/352,575

(22) PCT Filed: Oct. 8, 2012

(86) PCT No.: PCT/EP2012/069868
§ 371 (c)(1),
(2) Date: Apr. 17, 2014

(87) PCT Pub. No.: WO2013/057002
PCT Pub. Date: Apr. 25, 2013

(65) Prior Publication Data
US 2014/0239253 A1 Aug. 28, 2014

(30) Foreign Application Priority Data
Oct. 17, 2011 (DE) .......................... 10 2011 116 232

(51) Int. Cl.
| H01L 29/18 | (2006.01) |
| H01L 33/06 | (2010.01) |
| H01L 33/30 | (2010.01) |
| H01L 33/62 | (2010.01) |

(Continued)

(52) U.S. Cl.
CPC ................ *H01L 33/06* (2013.01); *H01L 27/15* (2013.01); *H01L 33/005* (2013.01); *H01L 33/08* (2013.01); *H01L 33/382* (2013.01); *H01L 2224/48463* (2013.01)

(58) Field of Classification Search
CPC .... H01L 33/08; H01L 27/156; H01L 25/0756
USPC .................. 257/76, 13, E21.09, E33.023, 99; 438/46; 372/44.01
See application file for complete search history.

(56) References Cited

U.S. PATENT DOCUMENTS
| 5,696,389 A | 12/1997 | Ishikawa et al. |
| 7,265,392 B2 | 9/2007 | Hahn et al. |

(Continued)

FOREIGN PATENT DOCUMENTS
| DE | 102008053731 A1 | 5/2010 |
| DE | 102009010480 A1 | 9/2010 |

(Continued)

*Primary Examiner* — Kimberly Rizkallah
*Assistant Examiner* — Brian Turner
(74) *Attorney, Agent, or Firm* — Slater & Matsil, L.L.P.

(57) ABSTRACT

A semiconductor chip with a layer stack includes a first semiconductor layer sequence and a second semiconductor layer sequence. The first semiconductor layer sequence includes a first semiconductor region of a first conductivity type, a second semiconductor region of a second conductivity type and an active zone arranged therebetween. The second semiconductor layer sequence includes the second semiconductor region of the second conductivity type, a third semiconductor region of the first conductivity type and a second active zone arranged therebetween.

17 Claims, 4 Drawing Sheets

(51) Int. Cl.
*H01L 27/15* (2006.01)
*H01L 33/08* (2010.01)
*H01L 33/38* (2010.01)
*H01L 33/00* (2010.01)

(56) References Cited

U.S. PATENT DOCUMENTS

| | | | |
|---|---|---|---|
| 7,459,727 | B2 | 12/2008 | Stauss |
| 7,842,958 | B1 | 11/2010 | Sekine et al. |
| 2006/0027820 | A1 | 2/2006 | Cao |
| 2006/0244002 | A1* | 11/2006 | Hooper et al. ............... 257/103 |
| 2008/0035936 | A1* | 2/2008 | Lester ............................. 257/79 |
| 2009/0272989 | A1 | 11/2009 | Shum et al. |
| 2010/0097690 | A1* | 4/2010 | Vurgaftman et al. ......... 359/344 |
| 2010/0171135 | A1 | 7/2010 | Engl et al. |
| 2010/0320491 | A1 | 12/2010 | Han |
| 2011/0012088 | A1 | 1/2011 | Strassburg et al. |
| 2011/0193123 | A1* | 8/2011 | Moon et al. ..................... 257/98 |
| 2011/0204376 | A1 | 8/2011 | Su et al. |
| 2011/0260205 | A1* | 10/2011 | Moosburger et al. ........... 257/99 |
| 2012/0064642 | A1* | 3/2012 | Huang et al. .................... 438/15 |

FOREIGN PATENT DOCUMENTS

| | | |
|---|---|---|
| EP | 1601026 A2 | 11/2005 |
| WO | 2009106063 A1 | 9/2009 |
| WO | 2011069769 A2 | 6/2011 |

* cited by examiner

OPTOELECTRONIC SEMICONDUCTOR CHIP AND METHOD FOR PRODUCING THE LATTER

This patent application is a national phase filing under section 371 of PCT/EP2012/069868, filed Oct. 8, 2012, which claims the priority of German patent application 10 2011 116 232.5, filed Oct. 17, 2011, each of which is incorporated herein by reference in its entirety.

TECHNICAL FIELD

The invention relates to an optoelectronic semiconductor chip with a first semiconductor layer sequence and a second semiconductor layer sequence. The present invention further relates to a method for producing such a semiconductor chip.

BACKGROUND

The drop in the efficiency of radiation-emitting semiconductor chips as current density increases has been a long-term problem, which, inter alia, limits brightness per given area and thus radiance. Semiconductor chips connected in series and/or stacked on one another may solve this problem in part. With semiconductor chips grown monolithically over one another and which emit radiation in the visible wavelength range, the large band gap results in extremely high dopant concentrations, wherein at the same time the dopants have high activation energy. This leads to a drastic reduction in effective charge carrier density and to ohmic losses, for example, at tunnel junctions, which can be integrated into the semiconductor chip.

It is conventionally known to achieve high radiances with semiconductor chips stacked vertically one above the other. In this case, the individual semiconductor chips are connected together by a crystalline tunnel junction or by bonding layers. Such stacked semiconductor chips may be operated at high efficiency, wherein the same quantity of light can be generated compared to single semiconductor chips but with such stacked semiconductor chips being operable at lower current densities. However, these vertically stacked semiconductor chips display an elevated operating voltage, since ohmic losses at the tunnel junction cannot be avoided. In addition, radiation efficiency is impaired by internal absorption in the semiconductor chip, even if the tunnel junction is operated in a loss-free manner.

European patent publication EP 1601026A1, which has counterpart U.S. Pat. No. 7,459,727, describes, for example, an optoelectronic component which comprises a layer stack comprising two semiconductor layer sequences of opposing orientation which are monolithically integrated. The semiconductor layer sequences each have a first semiconductor region and a second semiconductor region, between which an active zone is in each case arranged. A contact layer is arranged between the individual semiconductor layer sequences.

German patent publication DE 102008053731 describes an optoelectronic semiconductor chip with two active zones. In this case, the semiconductor chip is formed of two separate semiconductor bodies, which are joined together mechanically by a bonding layer.

SUMMARY OF THE INVENTION

Embodiments of the present invention provide an optoelectronic semiconductor chip with which high radiances can be generated, wherein at the same time ohmic losses in the semiconductor chip are avoided. Additional embodiments of the present invention provide a production method for a semiconductor chip improved in this way.

In one embodiment the optoelectronic semiconductor chip comprises a first semiconductor layer sequence, which comprises a first semiconductor region of a first conductivity type, a second semiconductor region of a second conductivity type and a first active zone arranged between the first semiconductor region and the second semiconductor region for generating a first electromagnetic radiation. The layer stack further comprises a second semiconductor layer sequence, which comprises the second semiconductor region of the second conductivity type, a third semiconductor region of the first conductivity type and a second active zone arranged between the second semiconductor region and the third semiconductor region for generating a second electromagnetic radiation.

A layer stack may, for example, be understood to mean a sequence of layers stacked on one another. The layers are preferably deposited epitaxially onto a growth substrate. The active zones are preferably arranged above one another in the vertical direction with their flat sides adjacent one another. That is to say, the layers of the layer stack are preferably monolithically integrated. The layers are then grown epitaxially above one another, without the arrangement between them of any non-epitaxially applied bonding agent—for instance in the form of a bonding layer.

The semiconductor chip thus comprises two semiconductor layer sequences each with an active zone, wherein the two semiconductor layer sequences share one semiconductor region. The first and second semiconductor layer sequence accordingly comprise a common second semiconductor region of the second conductivity type. Preferably just one semiconductor region of one conductivity type is located between the two active zones of the two semiconductor layer sequences. Overall, the layer stack comprises only exactly three semiconductor regions. As a result of the common semiconductor region, electrical connection of the semiconductor layer sequences may be achieved, for example, by metal contacts. Tunnel junctions between the semiconductor layer sequences or bonding layers are not necessary. The semiconductor chip thus is free of a tunnel junction or bonding layer between the semiconductor layer sequences. At the same time, operation of the semiconductor chip is made possible at low current density. Advantageously the phenomenon of current crowding in the semiconductor chip is reduced due to the low current density. Furthermore, fewer contacts are necessary for optimal current spreading, which results in a preferably simplified epitaxy structure, a reduction in contact surface area, and thus an increase in active surface area.

In particular, the epitaxy structure is simplified by the use of the common semiconductor region and by the omission of, for example, a multilayer system such as a superlattice, which is conventionally needed for formation of a low-ohmic tunnel junction.

Because of the common second semiconductor region, a dielectric mirror without external current spreading can additionally be used advantageously on the n-side of the semiconductor chip. This dielectric mirror is particularly advantageous due to its greater reflectivity than conventional metal mirrors and may further increase efficiency. Current spreading in the layer stack may advantageously proceed on the p-side. In addition, simplified, exact processing is possible with the current spreading layers used.

The first conductivity type of the first semiconductor region is, for example, an n-conductivity type. In this case, the conductivity type of the third semiconductor region is thus also an n-conductivity type. The second conductivity type of the second semiconductor region is here a p-conductivity type.

The first conductivity type may accordingly be a p-conductivity type and the second conductivity type an n-conductivity type.

In particular, the first conductivity type and second conductivity type differ from one another.

The semiconductor chip is an optoelectronic semiconductor chip which allows the conversion of electronically generated data or energy into light emission or vice versa. For example, the optoelectronic semiconductor chip comprises a radiation-emitting semiconductor chip, for example, an LED.

The active zones of the semiconductor chip preferably contain a pn-junction, a double heterostructure, a single quantum well structure (SQW) or a multi quantum well structure (MQW) for radiation generation. Here, the term quantum well structure does not have any meaning with regard to the dimensionality of the quantization. It encompasses inter alia quantum troughs, quantum wires and quantum dots and any combination of these structures.

The first and second semiconductor layer sequences preferably each comprise a semiconductor material. In particular, the first and second semiconductor layer sequences, especially the active zones, preferably contain a III/V semiconductor material. III/V semiconductor materials are particularly suitable for generating radiation in the ultraviolet, through the visible to the infrared spectral range.

The semiconductor chip, in particular the layer stack, comprises a plurality of semiconductor layers deposited epitaxially on one another, in which the first and second active zones are respectively arranged. The layers of the layer stack were, for example, grown on a growth substrate, which was subsequently at least partially or completely detached. The first and second semiconductor layer sequences are preferably monolithically integrated.

Because of the common second semiconductor region, no tunnel junction and/or bonding layers is/are arranged or necessary between the first semiconductor layer sequence and the second semiconductor layer sequence. In particular, the first semiconductor layer sequence and the second semiconductor layer sequence overlap. The first semiconductor layer sequence thus develops into the second semiconductor layer sequence, as the second semiconductor region is associated with both the first semiconductor layer sequence and the second semiconductor layer sequence.

According to at least one further embodiment, a current spreading layer is arranged on the side of the first semiconductor layer sequence remote from the second semiconductor layer sequence. The current spreading layer is, for example, a dielectric mirror, a metal mirror or a combined mirror. The current spreading layer does not necessarily have to be transparent or partially transparent to radiation emitted by the active zones. In this case, radiation outcoupling from the semiconductor chip proceeds on the side of the second semiconductor layer sequence, in particular via the third semiconductor region.

According to at least one further embodiment, a surface of the third semiconductor region remote from the second active zone comprises roughening and/or radiation outcoupling structures. Radiation outcoupling from the semiconductor chip preferably proceeds via the roughened or structured surface. The radiation outcoupling structures are preferably three-dimensional structures, for example, pyramids, truncated pyramids and/or lenticular shapes. The roughened surface or the surface provided with radiation outcoupling structures may in particular modify the angle at which the radiation generated in the active zones impinges on the boundary surface between layer stack and surrounding medium, such that this angle differs from the total reflection angle, so advantageously increasing radiation outcoupling efficiency.

According to at least one further embodiment, the semiconductor chip comprises at least one first opening, which extends from a surface of the first semiconductor region remote from the first active zone as far as into the second semiconductor region. The first opening accordingly extends completely through the first semiconductor region and the first active zone as far as into the second semiconductor region. In other words, the first opening breaks through the first semiconductor region and the first active zone, the opening preferably being completely surrounded by the first semiconductor region and the active zone. The first opening is accordingly a hole in the first semiconductor region and in the first active zone. The first opening preferably terminates in the second semiconductor region, such that the first opening does not continue to penetrate completely therethrough.

According to at least one further embodiment, a first electrical contact layer is arranged in the at least one first opening, which first electrical contact layer is electrically insulated from the first semiconductor region and the first active zone and electrically contacts the second semiconductor region. Electrical contacting of the second semiconductor region accordingly proceeds by the first electrical contact layer in the first opening. At the same time, the second semiconductor region may preferably be externally electrically contacted on the first semiconductor region side.

According to at least one further embodiment, a second electrical contact layer is arranged on the surface of the first semiconductor region remote from the first active zone, which second electrical contact layer is insulated electrically from the first electrical contact layer and electrically contacts the first semiconductor region. To this end, the second electrical contact layer is, for example, applied to the surface of the first semiconductor region remote from the second semiconductor region. In the region of the first opening this second electrical contact layer preferably likewise comprises an opening, through which the first electrical contact layer of the second semiconductor region passes. To insulate the first contact layer from the semiconductor layers and the first active zone and from the second contact layer, an electrically insulating layer is preferably arranged between these layers.

According to at least one further embodiment, a third electrical contact layer is arranged on a surface of the third semiconductor region remote from the second active zone, which third electrical contact layer extends on a side face of the semiconductor chip in electrically insulated manner relative to the semiconductor chip to the second electrical contact layer and electrically contacts the third semiconductor region. The second electrical contact layer and the third electrical contact layer are preferably not electrically insulated from one another, but rather are in electrical contact with one another. The third electrical contact layer is preferably transparent to radiation emitted by the active zones, being, for example, a TCO (Transparent Conductive Oxide) layer. In this way, efficient radiation outcoupling may also be ensured on the third semiconductor region side.

Electrical contacting as described via the three electrical contact layers allows external contacting with just two electrical terminal regions. The second and the third electrical contact layers are jointly electrically contacted externally, for example, by a bonding wire. The first electrical contact layer may, for example, be contacted via an electrically conductive carrier body, on which the first contact layer and then the layer stack of the semiconductor chip are arranged.

According to at least one further embodiment, the semiconductor chip comprises at least one second opening, which extends from the surface of the first semiconductor region remote from the first active zone as far as into the third semiconductor region. The at least one second opening accordingly extends through the first semiconductor region, the first active zone, the second semiconductor region and the second active zone into the third semiconductor region. In other words, the at least one second opening is preferably a hole in the first and second semiconductor regions and in the first and second active zones. In this case, the at least one second opening does not completely penetrate the third semiconductor region, such that the at least one second opening ends in the third semiconductor region.

According to at least one further embodiment, a second electrical contact layer is arranged in the at least one second opening, which second electrical contact layer is electrically insulated from the first active zone, the second semiconductor region and the second active zone and electrically contacts the third semiconductor region. The second electrical contact layer is accordingly suitable for contacting semiconductor regions of the first conductivity type. The electrical insulation is achieved, for example, by an electrically insulating layer, which encases the at least one second opening.

According to at least one further embodiment, the second electrical contact layer is additionally arranged on the side of the first semiconductor region remote from the first active zone and contacts the region electrically. The second electrical contact layer is accordingly suitable and provided for electrical contacting of the first and third semiconductor region of the first conductivity type, while the first electrical contact layer is suitable for electrical contacting of the second semiconductor region of the second conductivity type.

According to at least one embodiment, on the side of the first semiconductor region remote from the first active zone a third electrical contact layer is arranged, which is electrically insulated from the first contact layer and the second contact layer and electrically contacting the first semiconductor region. The electrical insulation between the individual contact layers may be ensured, for example, by an electrically insulating layer or by spacing from one another.

According to at least one further embodiment, the first electromagnetic radiation and the second electromagnetic radiation are identical. In this case the first active zone and the second active zone are substantially identical in terms of their configuration, their material and/or their thickness etc., such that the active zones are both suitable for emitting radiation in similar wavelength ranges. A similar wavelength range is understood in particular to mean that the radiations are in the same color coordinate range.

According to at least one alternative configuration, the first electromagnetic radiation is different from the second electromagnetic radiation. The radiations thus differ in their color coordinates. In this case, the semiconductor chip is suited to emitting mixed radiation of the first electromagnetic radiation and the second electromagnetic radiation, for example, white radiation. The first and second electromagnetic radiations are here coupled out of the semiconductor chip on the same radiation outcoupling side thereof.

According to at least one embodiment, a method for producing an optoelectronic semiconductor chip comprises the following method steps. A third semiconductor region of a first conductivity type is grown on a growth substrate. A second active zone suitable for generating a second electromagnetic radiation is grown on the third semiconductor region. A second semiconductor region of a second conductivity type is grown onto the second active zone. A first active zone suitable for generating a first electromagnetic radiation is grown onto the second semiconductor region. A first semiconductor region of a first conductivity type is grown on the first active zone.

The features and advantages mentioned in relation to the semiconductor chip also apply in relation to the production method and vice versa.

A semiconductor chip produced in this way is distinguished by a common second semiconductor region of the second conductivity type, which may be associated both with the first semiconductor layer sequence and with the second semiconductor layer sequence. In this way, high radiances may preferably be generated in a preferably loss-free manner, since no additional tunnel junctions and/or bonding layers arranged in the semiconductor chip are used. The layers of the individual semiconductor regions are grown successively on the growth substrate and thus produced in monolithically integrated manner. After the first semiconductor region is grown, the growth substrate may be completely or at least partly detached. In this case, the semiconductor chip is preferably mounted on an external carrier.

According to at least one embodiment of the production method, there are formed at least one first opening, which extends from a surface of the first semiconductor region remote from the first active zone as far as into the second semiconductor region, and/or at least one second opening, which extends from a surface of the first semiconductor region remote from the first active zone as far as into the third semiconductor region. The first and/or second openings serve in particular for electrical contacting of the second and/or third semiconductor regions from the first semiconductor region side. To this end, the openings are preferably encased by an electrically insulating layer, wherein a contact layer of electrically conductive material is then introduced into each of the first and/or second opening.

BRIEF DESCRIPTION OF THE DRAWINGS

Further advantages and advantageous further developments of the invention are revealed by the exemplary embodiments described below in conjunction with FIGS. 1 to 5, in which:

FIG. 3A to 5B show a schematic cross-section of additional exemplary embodiments of a semiconductor chip according to the invention.

DETAILED DESCRIPTION OF ILLUSTRATIVE EMBODIMENTS

In the figures, identical or identically acting components may in each case be provided with the same reference numerals. The components illustrated and their size ratios to one another should not be viewed as being to scale. Rather, individual elements such as for example layers, structures, components and regions can be shown exaggeratedly thick or large for greater ease of depiction and/or better comprehension.

Figure 2:
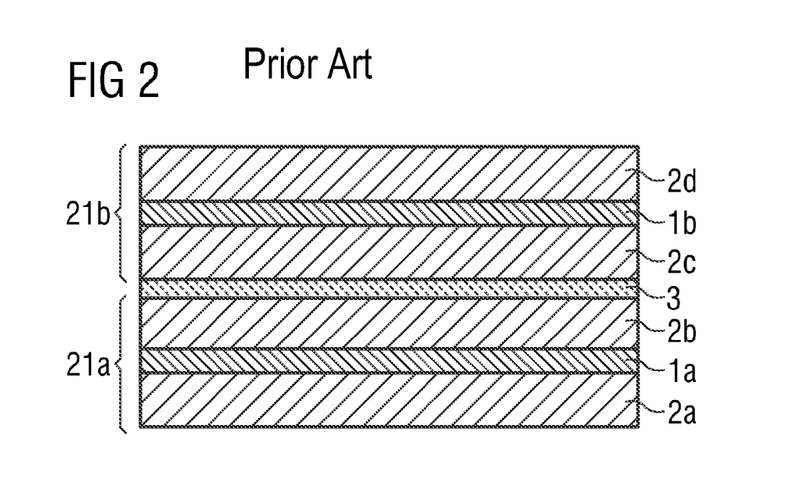
FIG. 2 shows a schematic cross-section of an exemplary embodiment of a semiconductor chip according to the prior art.

FIG. 2 shows a cross-section of a semiconductor chip with a layer stack according to the prior art. The semiconductor chip comprises a first semiconductor layer sequence 21a and a second semiconductor layer sequence 21b. The first semiconductor layer sequence 21a comprises a first semiconductor region 2a of a first conductivity type, a second semiconductor region 2b of a second conductivity type and a first active zone 1a arranged between the first semiconductor region 2a and the second semiconductor region 2b for generating a first electromagnetic radiation. The first conductivity type and second conductivity type differ from one another. For example, the first conductivity type is an n-conductivity type and the second conductivity type is a p-conductivity type or vice versa. The second semiconductor layer sequence 21b comprises a third semiconductor region 2c of the first conductivity type, a fourth semiconductor region 2d of the second conductivity type and a second active zone 1b arranged between the third semiconductor region 2c and the fourth semiconductor region 2d for generating a second electromagnetic radiation. The third semiconductor region is in turn of an n-conductivity type and the fourth semiconductor region a p-conductivity type or vice versa.

A tunnel junction 3 is arranged between the first semiconductor layer sequence 21a and the second semiconductor layer sequence 21b. The semiconductor layer sequences are preferably connected together by the crystalline tunnel junction 3 or a conductive bonding layer.

High radiances can advantageously be achieved by the semiconductor layer sequences 21a, 21b stacked vertically one above the other. At the same time, such stacked semiconductor chips may be operated with high efficiency. However, such semiconductor chips display an elevated operating voltage, since ohmic losses may occur at the tunnel junction 3. In addition, radiation efficiency may be impaired by internal absorption in the tunnel junction 3.

Figure 1A:
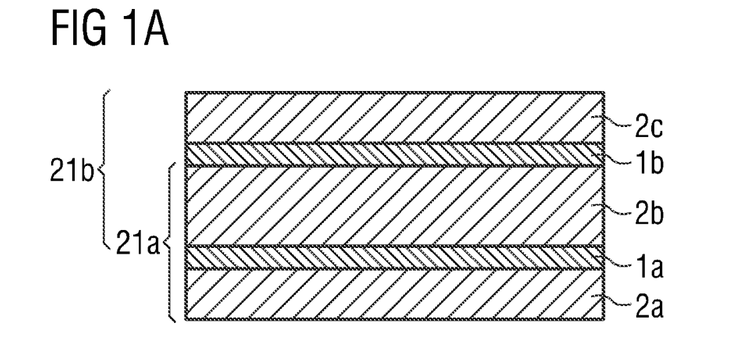
FIG. 1A shows a schematic cross-section of an exemplary embodiment of a semiconductor chip according to the invention.

FIG. 1A shows a semiconductor chip according to the invention, which avoids the disadvantages which conventionally arise. The optoelectronic semiconductor chip of FIG. 1A comprises a layer stack comprising a first semiconductor layer sequence 21a and a second semiconductor layer sequence 21b. The first semiconductor layer sequence 21a comprises a first semiconductor region 2a of a first conductivity type, a second semiconductor region 2b of a second conductivity type and a first active zone 1a arranged between the first semiconductor region 2a and the second semiconductor region 2b for generating a first electromagnetic radiation. The second semiconductor layer sequence 21b likewise comprises the second semiconductor region 2b of the second conductivity type and a third semiconductor region 2c of the first conductivity type. A second active zone 1b for generating a second electromagnetic radiation is arranged between the second semiconductor region 2b and the third semiconductor region 2c.

With the semiconductor chip according to the invention, a conventionally used tunnel junction or conventionally used bonding layers between the two semiconductor layer sequences 21a, 21b is/are thus avoided, as compared with the conventional semiconductor chip. The semiconductor layer sequences 21a, 21b in particular share the second semiconductor region 2b. In this respect, the semiconductor layer sequences each with an active zone are stacked on one another, such that optimal, high radiation efficiency may still be achieved.

The first conductivity type may be a p-conductivity type and the second conductivity type an n-conductivity type or vice versa. The semiconductor chip accordingly comprises the following sequence of conductivity types: p-n-p or n-p-n.

The active zones 1a, 1b may preferably be suitable for emitting radiation in the same wavelength range. Alternatively, the active zones 1a, 1b may be suitable for emitting radiation in different wavelength ranges, such that the semiconductor chip overall emits mixed radiation.

The active zones 1a, 1b each directly adjoin the second semiconductor region 2b. The second semiconductor region 2b thus forms a common semiconductor region of a conductivity type of the semiconductor layer sequences 21a, 21b. The semiconductor chip has no tunnel junction and no bonding layer between the active zones 1a and 1b. The common second semiconductor region 2b preferably has good lateral conductivity. The second semiconductor region 2b is shown in greater detail in FIG. 1B.

Figure 1B:
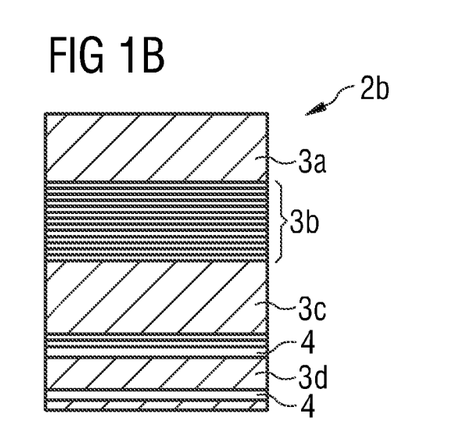
FIG. 1B shows a schematic cross-section of an exemplary embodiment of a second semiconductor region of a semiconductor chip according to the invention.

If the second semiconductor region 2b is of the n-type, an n-doped (Si, Ge) layer 3a is located adjacent the second active zone of the semiconductor chip. The side of this layer 3a remote from the second active zone is adjoined by a superlattice structure 3b of AlGaN/GaN or InGaN/GaN layers, which are preferably Si-doped. This superlattice structure 3b is preferably thinner than a conventional tunnel junction. The superlattice structure 3b is adjoined by a further n-doped layer 3c, which has a doping profile which increases towards the middle. This means that the middle of this layer 3c is highly doped, while the doping decreases towards the edges of the layer 3c. The layer 3c is preferably around 100 nm thick.

An AlGaN or InGaN layer 4 adjoins the layer 3c. Adjacent this layer 4 a layer 3d is arranged, which contains a two-dimensional carrier gas and is confined on the other side by a further AlGaN or InGaN layer 4. The two-dimensional carrier gas, for example, a two-dimensional electron gas, contributes to an increase in the transverse conductivity of the second semiconductor region.

If the second semiconductor region 2b is of the p-type, Mg is used mutatis mutandis for doping instead of Si or Ge. Otherwise the layer sequence matches the above-explained layer sequence.

Figure 3A:
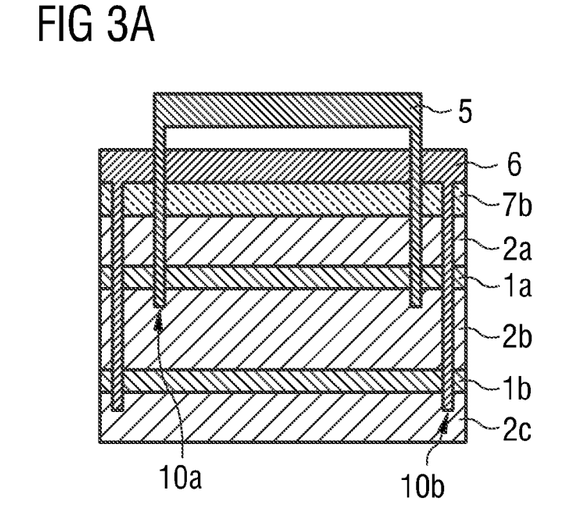
Figure 3B:
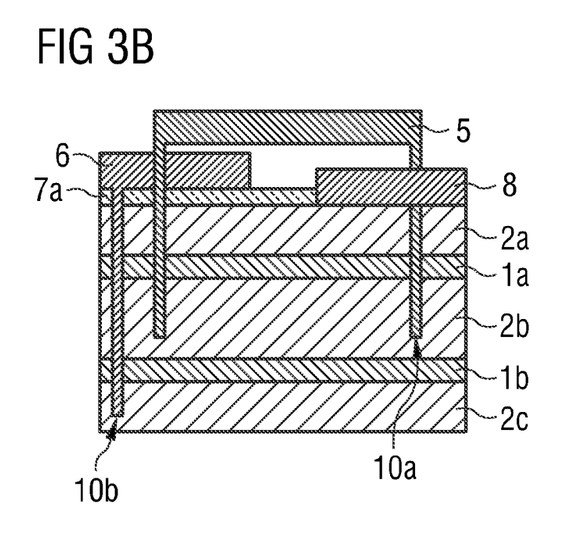

FIGS. 3A and 3B show possible electrical contacting arrangements for a semiconductor chip according to the exemplary embodiment of FIG. 1A. The individual semiconductor regions of the semiconductor chip are preferably electrically contacted by way of through vias. Such alternative through via options are shown in FIGS. 3A and 3B.

The second semiconductor region 2b of the exemplary embodiment of FIG. 3A is contacted by two first through vias 10a, which extend from a surface of the first semiconductor region 2a remote from the first active zone 1a as far as into the second semiconductor region 2b. The first openings 10a are preferably spaced from one another, such that the best possible lateral current spreading can be achieved. A first electrical contact layer 5 is arranged in the first openings 10a, which first electrical contact layer is electrically insulated from the first semiconductor region 2a and the first active zone 1a and electrically contacts the second semiconductor region 2b. To achieve this electrically insulated arrangement, an electrically insulating layer is used, for example, which encases the first openings 10a and insulates the first contact layer 5 electrically from the other layers. The first electrical contact layer 5 preferably completely fills the first openings 10a. In addition, the first contact layer 5 preferably covers the majority of the first semiconductor region 2a, such that the material of the first contact layer 5 of the one first opening 10a is connected with that of the second first opening 10a.

The third semiconductor region 2c is preferably electrically contacted by second openings 10b, which extend from a surface of the first semiconductor region 2a remote from the first active zone 1a as far as into the third semiconductor region 2c. The second openings 10b accordingly extend almost completely through the semiconductor chip layer stack. A second electrical contact layer 6 is preferably arranged in the second openings 10b, which second electrical contact layer is electrically insulated from the second semiconductor region 2b, the second active zone 1b and the first active zone 1a and electrically contacts the third semiconductor region 2c. For electrical contacting of the first semiconductor region 2a, the second contact layer 6 is additionally preferably arranged over the entire surface on the first semiconductor region 2a side. In plan view onto the active zones 1a, 1b the first electrical contact layer 5 and the second electrical contact layer 6 overlap at least in places. Between the first semiconductor region 2a and the second contact layer 6 a current spreading layer 7b and/or a dielectric mirror is/are preferably arranged, through which the first and second openings 10a, 10b pass. The first openings 10a likewise extend through the second contact layer 6.

If the second semiconductor region 2b is an n-type region, then the first contact layer 5 is an n-contact layer and the second contact layer 6 a p-contact layer, or vice versa.

FIG. 3B shows an alternative configuration of electrical contacting of the semiconductor chip. Unlike in the exemplary embodiment shown in FIG. 3A, electrical contacting of the first semiconductor region 2a and of the third semiconductor region 2c is separate. In this case there is just one second opening 10b, which passes through the semiconductor regions 2a, 2b, 2c and active zones 1a, 1b. The second contact layer 6 is not formed over the entire surface of the first semiconductor region 2a, but rather covers merely a subregion. By means of an electrically insulating layer 7a, a third contact layer 8, which electrically contacts the first semiconductor region 2a, is arranged electrically insulated from this second contact layer 6. To this end, the third contact layer 8 is arranged directly on the first semiconductor region 2a and connected electrically therewith. Accordingly, no openings are used for contacting the first semiconductor region 2a.

Figure 4A:
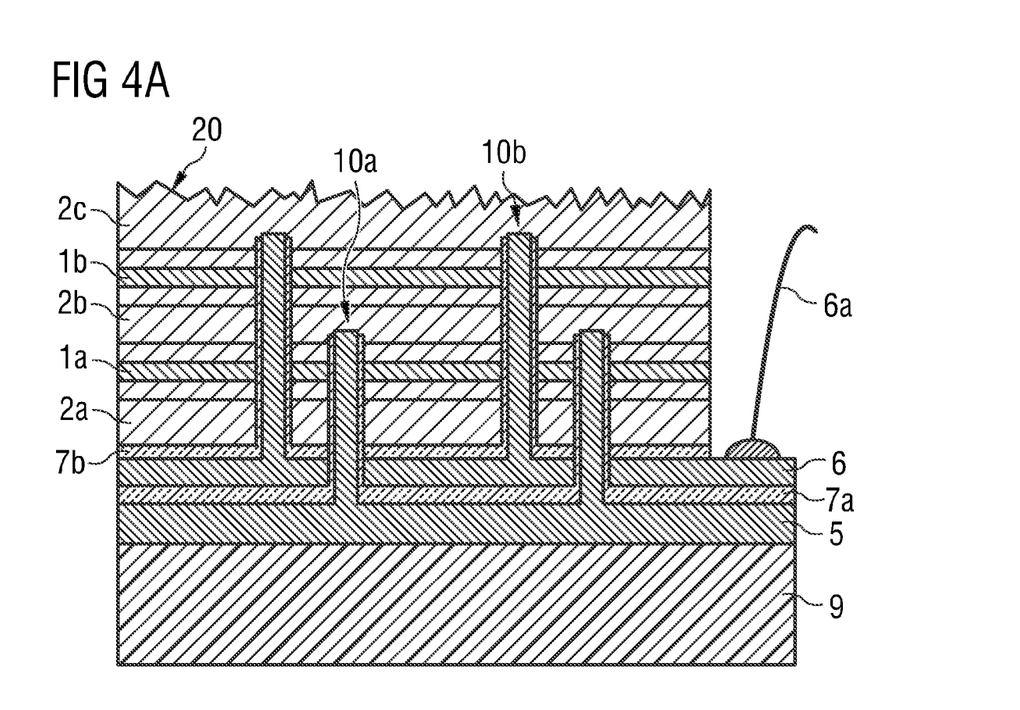
Figure 4B:
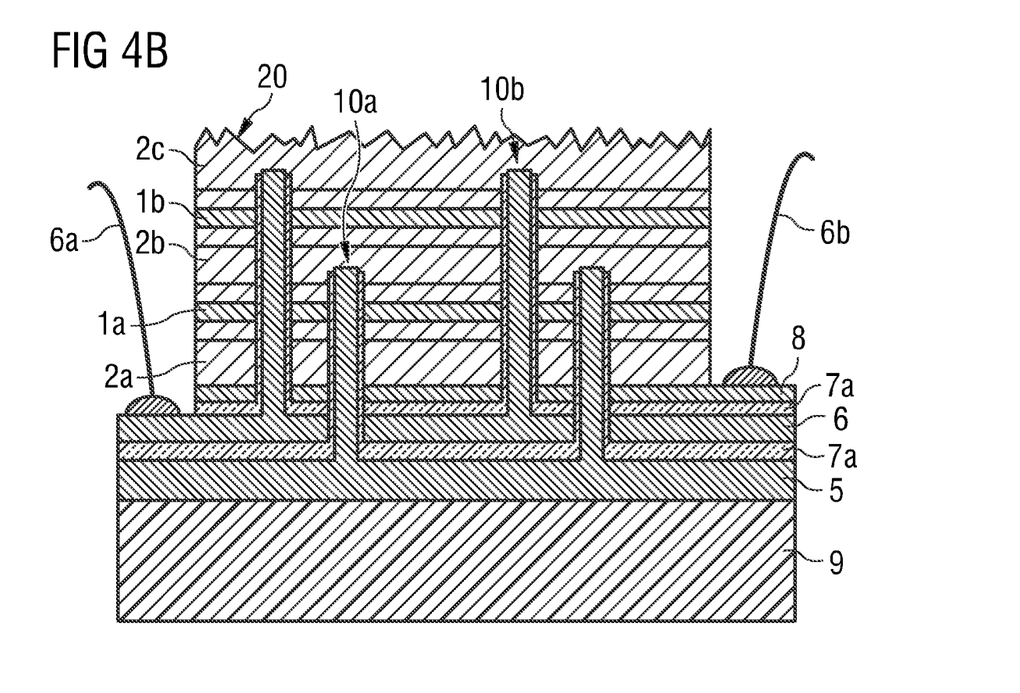
Figure 5A:
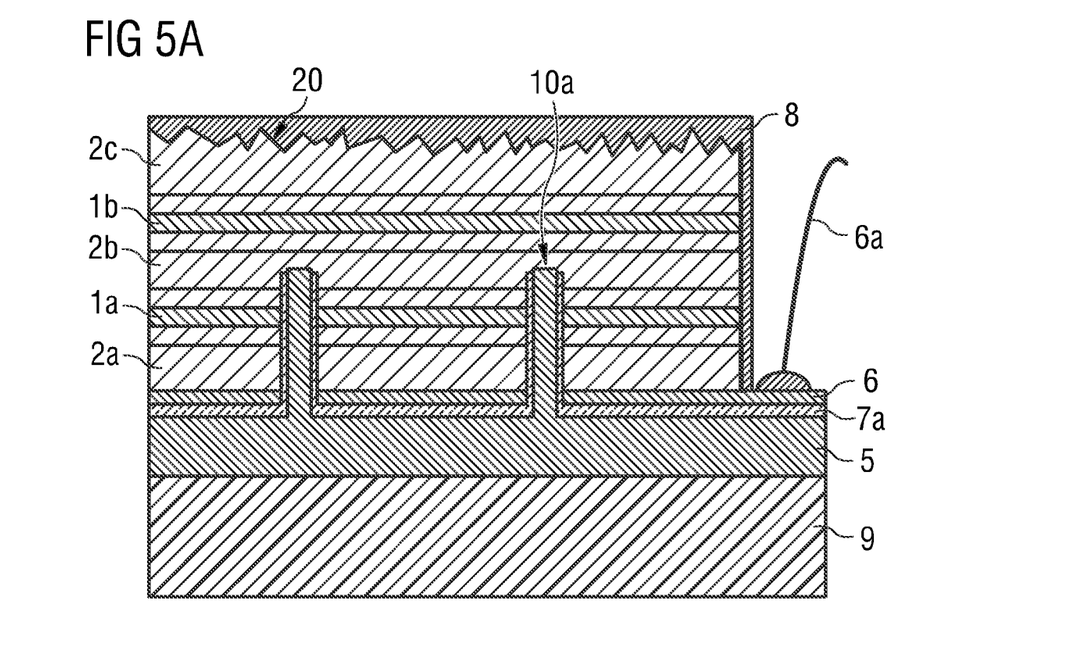

The principle of joint electrical contacting of the first and third semiconductor regions, as shown in the exemplary embodiment of FIG. 3A, is used in the exemplary embodiments of FIGS. 4A and 5A. The principle of separate electrical contacting of the first and third semiconductor regions according to the exemplary embodiment of FIG. 3B is used in FIGS. 4B and 5B.

The semiconductor chip according to the exemplary embodiment of FIG. 4A in turn comprises the layer stack illustrated in FIG. 1A. The layer stack is in this case arranged on a preferably electrically conductive carrier 9. The first semiconductor region 2a is arranged on the carrier 9, such that the third semiconductor region 2c is arranged remote from the carrier. Electrical contacting proceeds from the carrier 9 side, thus in particular between layer stack and carrier 9. For electrical contacting first openings 10a and second openings 10b are again used.

On the opposite side from the carrier 9 the layer stack comprises roughening 20 and/or radiation outcoupling structures, which preferably increase outcoupling efficiency. The radiation generated in the active zones 1a, 1b is accordingly coupled out from the semiconductor chip on the third semiconductor region 2c side.

A first contact layer 5 is arranged on the carrier 9 and extends into the first openings 10a as far as to the second semiconductor region 2b. The first contact layer 5 is accordingly suitable for electrical contacting of the second semiconductor region 2b. A second contact layer 6 is arranged over the first contact layer 5, wherein an electrically insulating layer 7a is formed between first contact layer 5 and second contact layer 6. The second contact layer 6 extends into the second openings 10b, such that the second contact layer 6 is suitable for electrical contacting of the third semiconductor region 2c. In addition, the second electrical contact layer 6 is in direct contact with the first semiconductor region 2a via a current spreading layer 7b, such that the second contact layer 6 is likewise suitable for electrical contacting of the first semiconductor region 2a. The electrical contact layers are each electrically insulated relative to one another and to the further layers of the layer stack.

Electrical contacting of the second contact layer 6 preferably proceeds by a bonding wire 6a and of a terminal region, at which the bonding wire 6a is electrically connected to the second contact layer 6. Electrical connection of the first contact layer 5 preferably proceeds via the carrier 9, which in this case is electrically conductive.

The exemplary embodiment of FIG. 4B differs from the exemplary embodiment of FIG. 4A in that the first semiconductor region 2a and third semiconductor region 2c are electrically contacted separately from one another. The third semiconductor region 2c is again electrically contacted via the second openings 10b and the second contact layer 6. The second contact layer 6 can again be externally electrically connected by a bonding wire 6a. As in the exemplary embodiment of FIG. 4A, the second semiconductor region 2b may be externally electrically connected via the first contact layer 5 and via the electrically conductive carrier 9. The first semiconductor region 2a is electrically contacted via a third contact layer 8 and a second bonding wire 6b. Between the individual contact layers 5, 6, 8 and the individual semiconductor layers of different types, electrically insulating layers are again used.

The exemplary embodiment of FIG. 5A differs from the exemplary embodiment of FIG. 4A in that only first openings 10a with a first electrical contact layer 5 are used, which contact the second semiconductor region 2b electrically. Second openings are not integrated into the semiconductor chip.

The first semiconductor region 2a is electrically contacted with a second contact layer 6 and a bonding wire 6a. The third semiconductor region 2c is contacted electrically via a contact layer 8 transparent to the radiation generated in the active zones 1a, 1b, which contact layer is arranged over the entire surface of the side of the third semiconductor region 2c remote from the carrier 9 and passes over side faces of the semiconductor chip to the second electrical contact layer 6. On the side faces the third electrical contact layer 8 is electrically insulated from the layers of the layer stack, for example, by an electrically insulating layer.

Otherwise the exemplary embodiment of FIG. 5A substantially matches the exemplary embodiment of FIG. 4A.

Figure 5B:
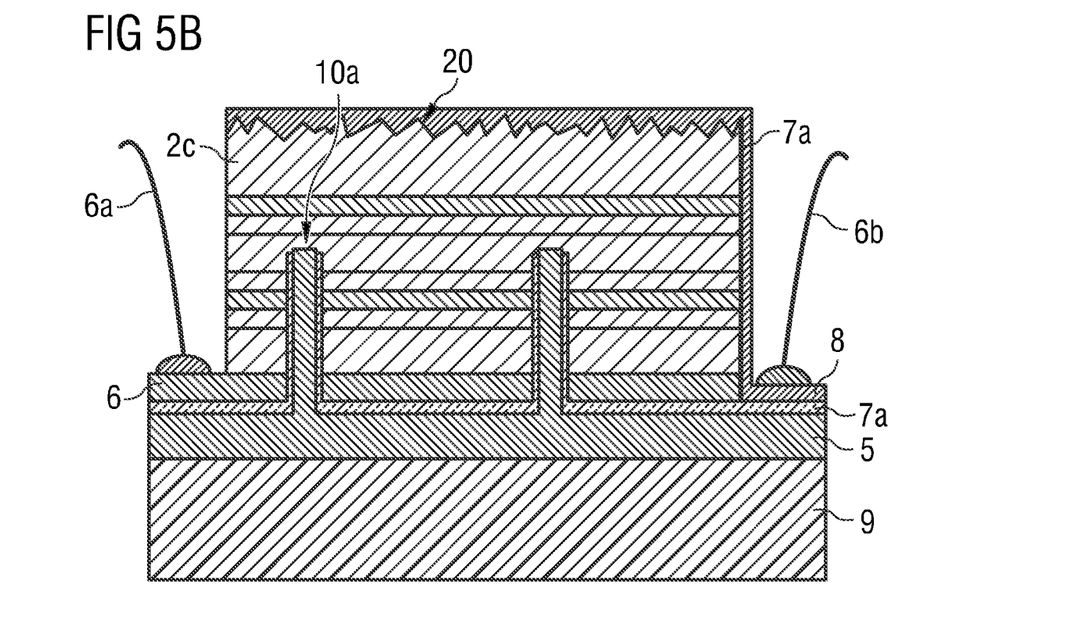

The exemplary embodiment of FIG. 5B differs from the exemplary embodiment of FIG. 5A in that the first semiconductor region 2a and third semiconductor region 2c are electrically contacted separately from one another. To this end, the third contact layer 8 is electrically insulated from the first contact layer 5. Insulation is again provided, for example, by an electrically insulating layer 7a. The third contact layer 8 and the second contact layer 6 are each electrically connectable separately from one another by means respectively of a bonding wire 6a, 6b.

Otherwise, the exemplary embodiment of FIG. 5B substantially matches the exemplary embodiment of FIG. 5A.

The invention is not limited to the exemplary embodiments as a result of the description made with reference thereto, but instead the invention encompasses any novel feature and any combination of features, including in particular any combination of features in the claims, even if these features or these combinations are not themselves explicitly indicated in the claims or exemplary embodiments.

The invention claimed is:

1. An optoelectronic semiconductor chip having a layer stack comprising:
   a first semiconductor layer sequence comprising a first semiconductor region of a first conductivity type, a second semiconductor region of a second conductivity type and a first active zone being arranged between the first semiconductor region and the second semiconductor region, the first active zone being configured to generate a first electromagnetic radiation; and
   a second semiconductor layer sequence comprising the second semiconductor region of the second conductivity type, a third semiconductor region of the first conductivity type and a second active zone being arranged between the second semiconductor region and the third semiconductor region, the second active zone being configured to generate a second electromagnetic radiation,
   wherein the second semiconductor region is contacted through two first openings which are spaced apart from one another and extend from a surface of the first semiconductor region remote from the first active zone as far as into the second semiconductor region,
   wherein a first electrical contact layer is arranged in the two first openings for forming two first through vias, and
   wherein the first electrical contact layer covers the first semiconductor region so that the two first through vias are electrically connected to each other by the first electrical contact layer covering the first semiconductor region.

2. The semiconductor chip according to claim 1, wherein no tunnel junction or bonding layers is arranged between the first semiconductor layer sequence and the second semiconductor layer sequence.

3. The semiconductor chip according to claim 1, wherein the first electrical contact layer is electrically insulated from the first semiconductor region and from the first active zone and electrically contacts the second semiconductor region.

4. The semiconductor chip according to claim 3, further comprising a second electrical contact layer arranged on the surface of the first semiconductor region remote from the first active zone, wherein the second electrical contact layer is insulated electrically from the first electrical contact layer and electrically contacts the first semiconductor region.

5. The semiconductor chip according to claim 4, further comprising a third electrical contact layer arranged on a surface of the third semiconductor region remote from the second active zone, wherein the third electrical contact layer extends on a side face of the semiconductor chip—in an electrically insulated manner relative to the semiconductor chip—to the second electrical contact layer and electrically contacts the third semiconductor region.

6. The semiconductor chip according to claim 4, further comprising a second opening that extends from the surface of the first semiconductor region remote from the first active zone as far as into the third semiconductor region.

7. The semiconductor chip according to claim 6, wherein the second electrical contact layer is arranged in the second opening, and wherein the second electrical contact layer is electrically insulated from the first active zone, the second semiconductor region and the second active zone and electrically contacts the third semiconductor region.

8. The semiconductor chip according to claim 7, wherein the second electrical contact layer is also arranged on a side of the first semiconductor region remote from the first active zone and contacts the first semiconductor region electrically.

9. The semiconductor chip according to claim 1, further comprising a second electrical contact layer and a third electrical contact layer arranged on a side of the first semiconductor region remote from the first active zone, wherein the second electrical contact layer is electrically insulated from the first electrical contact layer and electrically contacts the third semiconductor region, and wherein the third electrical contact layer is electrically insulated from the first electrical contact layer and from the second electrical contact layer and electrically contacts the first semiconductor region.

10. The semiconductor chip according to claim 1, wherein a current spreading layer is arranged on a side of the first semiconductor layer sequence remote from the second semiconductor layer sequence.

11. The semiconductor chip according to claim 1, wherein a surface of the third semiconductor region remote from the second active zone comprises roughening and/or radiation outcoupling structures.

12. The semiconductor chip according to claim 1, wherein the first electromagnetic radiation is different from the second electromagnetic radiation.

13. An optoelectronic semiconductor chip having a layer stack comprising:
   a first semiconductor layer sequence comprising a first semiconductor region of a first conductivity type, a second semiconductor region of a second conductivity type and a first active zone being arranged between the first semiconductor region and the second semiconductor region, the first active zone being configured to generate a first electromagnetic radiation;
   a second semiconductor layer sequence comprising the second semiconductor region of the second conductivity type, a third semiconductor region of the first conductivity type and a second active zone being arranged between the second semiconductor region and the third semiconductor region the second active zone being configured to generate a second electromagnetic radiation;
   a plurality of first openings that are spaced apart from one another and that extend from a surface of the first semiconductor region remote from the first active zone to electrically contact the second semiconductor region;
   a first electrical contact layer arranged in the first openings, wherein the first electrical contact layer covers a majority of the first semiconductor region such that material of the first electrical contact layer of one first opening is electrically connected to material of a another first opening; and
   at least one second opening which extends from the surface of the first semiconductor region remote from the first active zone as far as into the third semiconductor region; and
   a second electrical contact layer arranged on the surface of the first semiconductor region remote from the first active zone,
   wherein the second electrical contact layer is electrically connected to the first semiconductor region,
   wherein the second electrical contact layer extends into the second opening and thereby electrically contacting the third semiconductor region, and
   wherein the second electrical contact layer comprises an opening in a region of one of the first openings such that the first electrical contact layer passes through that opening of the second electrical contact layer.

14. The optoelectronic semiconductor chip according to claim 13, wherein the first electrical contact layer passes through the opening of the second electrical contact layer without electrically contacting the second electrical contact layer.

15. The optoelectronic semiconductor chip according to claim 13, wherein the second semiconductor region comprises a superlattice structure.

16. The optoelectronic semiconductor chip according to claim 13, wherein the second semiconductor region comprises an n-doped layer that has a doping profile that increases towards a middle of the n-doped layer such that the middle of the n-doped layer is highly doped.

17. The optoelectronic semiconductor chip according to claim 13, wherein the second semiconductor region comprises a layer that contains a two-dimensional charge carrier gas.

* * * * *